US007446602B2

(12) United States Patent
Yoshikawa (10) Patent No.: US 7,446,602 B2
(45) Date of Patent: Nov. 4, 2008

(54) SWITCHED CAPACITOR AMPLIFIER CIRCUIT AND METHOD FOR OPERATING A SWITCHED CAPACITOR AMPLIFIER CIRCUIT

(75) Inventor: Kiyoshi Yoshikawa, Chiba (JP)

(73) Assignee: Seiko Instruments Inc., Chiba (JP)

( * ) Notice: Subject to any disclaimer, the term of this patent is extended or adjusted under 35 U.S.C. 154(b) by 86 days.

(21) Appl. No.: 11/703,069

(22) Filed: Feb. 6, 2007

(65) Prior Publication Data
US 2007/0194844 A1 Aug. 23, 2007

(51) Int. Cl.
*H03F 1/02* (2006.01)
(52) U.S. Cl. .............................. 330/9; 330/69
(58) Field of Classification Search ............. 330/9, 330/69; 327/124, 307
See application file for complete search history.

(56) References Cited

U.S. PATENT DOCUMENTS

| | | | |
|---|---|---|---|
| 4,697,152 A * | 9/1987 | Westwick | 330/9 |
| 4,933,642 A | 6/1990 | Lee | |
| 6,169,427 B1 * | 1/2001 | Brandt | 327/94 |
| 6,940,348 B2 * | 9/2005 | Confalonieri et al. | 330/69 |
| 7,295,143 B2 * | 11/2007 | Ambo et al. | 341/172 |

* cited by examiner

*Primary Examiner*—Henry K Choe
(74) *Attorney, Agent, or Firm*—Brinks Hofer Gilson & Lione (57) ABSTRACT

Provided are a switched capacitor amplifier capable of removing an influence of an offset voltage and a 1/f noise using a simple circuit, and a method of operating the same.

According to the present invention, a switched capacitor amplifier having an operational amplifier and switched capacitors includes: a first switched capacitor one terminal of which is connected with a plus (+) input terminal of the operational amplifier and another terminal of which is applied with an input voltage; a second switched capacitor one terminal of which is connected with a minus (−) input terminal of the operational amplifier and another terminal of which is applied with an input voltage; a third switched capacitor which is inserted between the plus (+) input terminal and a plus (+) output terminal and provided to set an amplification factor in cooperation with the first switched capacitor and store a plus (+) compensation voltage for compensating for an offset, which is applied to the plus (+) input terminal; and a fourth switched capacitor which is inserted between the minus (−) input terminal and a minus (−) output terminal and provided to set an amplification factor in cooperation with the second switched capacitor and store a minus (−) compensation voltage for compensating for an offset, which is applied to the minus (−) input terminal.

6 Claims, 6 Drawing Sheets

SWITCHED CAPACITOR AMPLIFIER CIRCUIT AND METHOD FOR OPERATING A SWITCHED CAPACITOR AMPLIFIER CIRCUIT

TECHNICAL FIELD

The present invention relates to a switched capacitor amplifier having an offset adjustment function for a differential amplifier and a method of operating the switched capacitor amplifier.

BACKGROUND ART

A differential amplifier has a voltage offset caused by variations in characteristics of elements at a time of manufacture. When, for example, an output of a sensor is to be amplified, an offset voltage is added to an output signal of the sensor or subtracted therefrom, so high-precision measurement cannot be performed.

Figure 6:
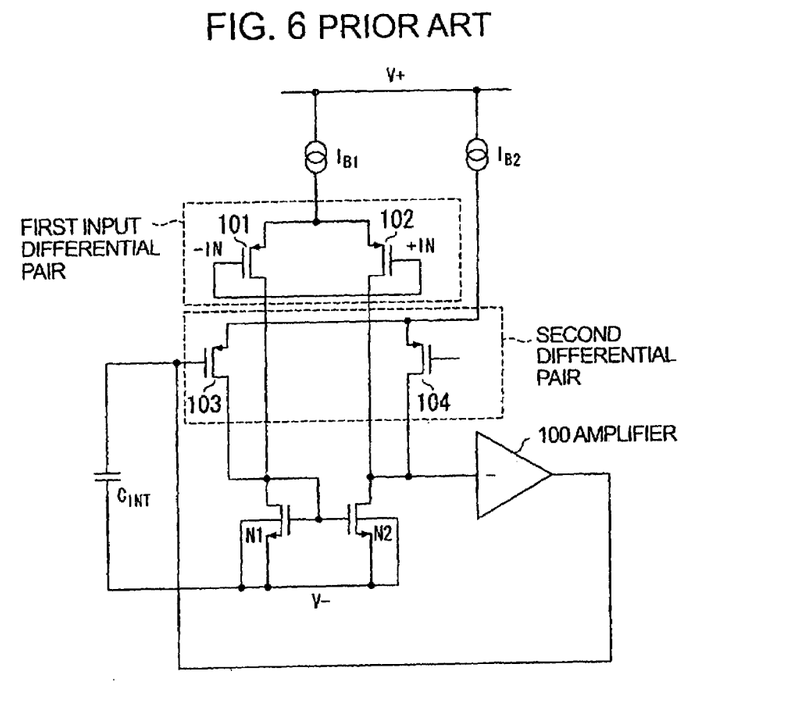
FIG. 6 is a concept explanatory diagram showing a conventional operational amplifying circuit for canceling an offset voltage.

Therefore, according to Patent Document 1, an input offset is cancelled by a circuit structure shown in FIG. 6 to perform processing for removing the influence of the offset on the output signal of the sensor to be amplified.

That is, as shown in FIG. 6, when amplification processing is to be performed, gate electrodes of MOS transistors 101 and 102 included in a first input differential pair are short-circuited. Therefore, a state in which the same input voltage is inputted to a differential amplifying circuit is obtained, with the result that a voltage appearing at an output terminal is inputted to an amplifier 100 for measuring an offset voltage.

The amplifier 100 is an amplifier for inverting and amplifying an inputted voltage. Feedback control is performed so as to cancel an offset added by the MOS transistors 101 and 102 to obtain the offset voltage. The offset voltage is held by a capacitor $C_{INT}$.

As a result, the offset voltage is negatively fed back to a gate electrode of a MOS transistor 103 included in a second differential pair for controlling output current terminals of the first input differential pair. A predetermined voltage is applied to a gate electrode of a MOS transistor 104 included in the second differential pair. According to the above-mentioned processing, the amplification can be performed by the first input differential pair while the offset voltage is substantially cancelled.

[Patent Document 1] U.S. Pat. No. 4,933,642

Up to now, a 1/f noise generated in a MOS transistor at a low frequency has been known as a noise of the amplifier.

The 1/f noise has a characteristic that it increases as a frequency reduces. Therefore, when the MOS transistor is used to amplify a sensor output, the sensor output is significantly influenced by the 1/f noise because a large number of sensor outputs which are to be amplified are relatively low-frequency signals. Thus, even when the voltage offset is removed, the amplification processing cannot be performed on the sensor output at high precision.

A 1/f noise of each of the MOS transistors 103 and 104 is added to a 1/f noise of the amplifier 100, so a total 1/f noise becomes larger than that of a normal noise.

Up to now, a chopper amplifier is used as described in Patent Document 1. However, there is a problem about the offset as described above, and that the circuit structure for removing the offset becomes complicated. Therefore, as to an amplifier used for a small-size and low-power consumption product, there are disadvantages in which a circuit scale becomes larger, a cost rises, and power consumption increases.

The present invention has been made in view of the above-mentioned circumstances. Therefore, an object of the present invention is to provide a switched capacitor amplifier capable of removing the influence of an offset voltage and a 1/f noise by using a simple circuit, and a method of operating the switched capacitor amplifier.

SUMMARY OF THE INVENTION

A switched capacitor amplifier according to the present invention includes an operational amplifier and switched capacitors, for amplifying a differential voltage between voltages inputted to a plus (+) input terminal and a minus (−) input terminal of the operational amplifier while an offset including a noise of the operational amplifier is compensated, and outputting an amplified voltage between a plus (+) output terminal and a minus (−) output terminal, the switched capacitor amplifier characterized by including: a first switched capacitor one terminal of which is connected with the plus (+) input terminal and an other terminal of which is applied with an input voltage; a second switched capacitor one terminal of which is connected with the minus (−) input terminal and an other terminal of which is applied with an input voltage; a third switched capacitor which is inserted between the plus (+) input terminal and the plus (+) output terminal and provided to set an amplification factor in cooperation with the first switched capacitor and store a plus (+) compensation voltage for compensating for an offset, which is applied to the plus (+) input terminal; and a fourth switched capacitor which is inserted between the minus (−) input terminal and the minus (−) output terminal and provided to set an amplification factor in cooperation with the second switched capacitor and store a minus (−) compensation voltage for compensating for an offset, which is applied to the minus (−) input terminal.

The switched capacitor amplifier according to the present invention includes a short-circuit switch connected between the plus (+) input terminal and the minus (−) input terminal. The plus (+) compensation voltage and the minus (−) compensation voltage are stored based on voltages outputted from the plus (+) output terminal and the minus (−) output terminal, when a compensation voltage at the plus (+) input terminal and a compensation voltage at the minus (−) input terminal are to be stored in the third switched capacitor and the fourth switched capacitor, while this short-circuit switch is turned on to short-circuit between the plus (+) input terminal and the minus (−) input terminal.

The switched capacitor amplifier according to the present invention includes a first resistor, a second resistor, and a third resistor connected in series between the plus (+) output terminal and the minus (−) output terminal. One terminal of the second resistor is connected with the third switched capacitor and an other terminal of the second resistor is connected with the fourth switched capacitor when the plus (+) compensation voltage and the minus (−) compensation voltage are to be stored in the third switched capacitor and the fourth switched capacitor, respectively.

In the switched capacitor amplifier according to the present invention, when an amplification factor of the switched capacitor amplifier is expressed by G, an amplification factor of the operational amplifier is expressed by g, a resistance value of each of the first and third resistors is expressed by R1, and a resistance value of the second resistor is expressed by R2, a relationship among the resistance values of the first resistor, the second resistor, and third resistor is expressed by a formula: R2/(2R1+R2)=G/g.

In the switched capacitor amplifier according to the present invention, processing for storing the plus (+) compensation voltage and the minus (−) compensation voltage is performed at a cycle shorter than cycle of a 1/f noise during a period for which differential amplification processing is not performed.

According to the present invention, there is provided a method of operating a switched capacitor amplifier, the switch capacitor amplifier including: an operational amplifier; a first switched capacitor one terminal of which is connected with a plus (+) input terminal of the operational amplifier and an other terminal of which is applied with an input voltage, a second switched capacitor one terminal of which is connected with a minus (−) input terminal of the operational amplifier and an other terminal of which is applied with an input voltage; a third switched capacitor which is inserted between the plus (+) input terminal and the plus (+) output terminal and provided to set an amplification factor in cooperation with the first switched capacitor and store a plus (+) compensation voltage to be applied to the plus (+) input terminal; a fourth switched capacitor which is inserted between the minus (−) input terminal and the minus (−) output terminal and provided to set an amplification factor in cooperation with the second switched capacitor and store a minus (−) compensation voltage to be applied to the minus (−) input terminal ; and short-circuit switch connected between the plus (+) input terminal and the minus (−) input terminal, for amplifying a differential voltage between voltages inputted to the plus (+) input terminal and the minus (−) input terminal of the operational amplifier, and outputting an amplified voltage between a plus (+) output terminal and a minus (−) output terminal, the method characterized by including the steps of: turning on the short-circuit switch when the plus (+) compensating voltage and the minus (−) compensation voltage are to be stored in the third switched capacitor and the fourth switched capacitor, respectively, to store the plus (+) compensation voltage and the minus (−) compensation voltage based on voltages outputted from the plus (+) output terminal and the minus (−) output terminal.

As described above, according to the present invention, processing for simultaneously canceling the influence of the offset voltage and the 1/f noise can be performed at the time of measurement without an increase in circuit scale. Therefore, the differential amplification precision of an output signal of a sense amplifier can be improved.

According to the present invention, the circuit scale can be made equal to that in a conventional case, so the power consumption does not increase. Thus, the switched capacitor amplifier can be used to reduce a noise in a small scale circuit, whose power consumption is low, of a mobile device or the like.

DETAILED DESCRIPTION OF THE PREFERRED EMBODIMENTS

The present invention relates to a switched capacitor amplifier (differential amplifying circuit) having an operational amplifier and switched capacitors, for amplifying a differential voltage between voltages inputted to a plus (+) input terminal and a minus (−) input terminal of the operational amplifier while an offset including a noise of a differential amplifier is compensated and for outputting an amplified voltage between a plus (+) output terminal and a minus (−) output terminal. The switched capacitor amplifier includes a first switched capacitor (switched capacitor 1) whose one terminal is connected with the plus (+) input terminal and the other terminal is applied with an input voltage and a second switched capacitor (switched capacitor 2) whose one terminal is connected with the minus (−) input terminal and the other terminal is applied with an input voltage. A structure for compensating for the offset including the noise of the differential amplifier includes a third switched capacitor (switched capacitor 3) which is inserted between the plus (+) input terminal and the plus (+) output terminal and provided to set an amplification factor in cooperation with the first switched capacitor and store a plus (+) compensation voltage for compensating for an offset, which is applied to the plus (+) input terminal and a fourth switched capacitor (switched capacitor 4) which is inserted between the minus (−) input terminal and the minus (−) output terminal and provided to set an amplification factor in cooperation with the second switched capacitor and store a minus (−) compensation voltage for compensating for an offset, which is applied to the minus (−) input terminal.

Figure 1:
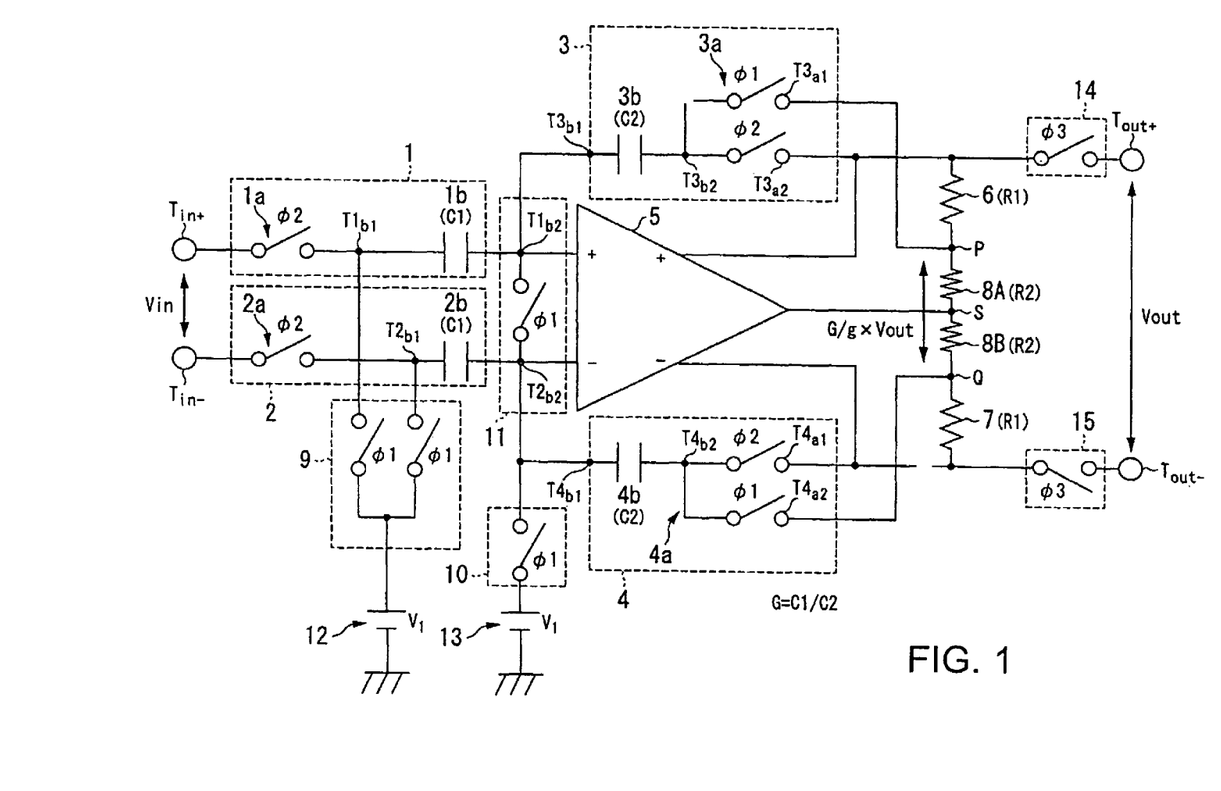
FIG. 1 is a concept diagram showing a structural example of a switched capacitor according to an embodiment of the present invention.

Hereinafter, a switched capacitor amplifier according to an embodiment of the present invention will be described with reference to the attached drawings. FIG. 1 is a block diagram showing a structural example of the switched capacitor amplifier according to this embodiment.

In this figure, the switched capacitor amplifier includes switched capacitors 1, 2, 3 and 4, an operational amplifier 5, resistors 6, 7, 8A, 8B, and 11, and switches 9 and 10.

The switched capacitor 1 includes a switch 1$a$ and a capacitor 1$b$ which are connected in series. The switch 1$a$ includes two terminals and has an on (connected) state and an off (disconnected) state. One terminal is connected with the capacitor 1$b$ and the other terminal is connected with an input terminal $T_{in+}$. The switch 1$a$ becomes the on state while a pulse $\psi 2$ is inputted thereto, so one terminal $T1_{b1}$ of the capacitor 1$b$ connected therewith is electrically connected with the input terminal $T_{in+}$. On the other hand, the switch 1$a$ becomes the off state while the pulse $\psi 2$ is not inputted thereto, so the terminal $T1_{b1}$ and the input terminal $T_{in+}$ are made into an opened state.

The other terminal (terminal $T1_{b2}$) of the capacitor 1$b$ is connected with a plus (+) input terminal of the operational amplifier 5.

The switched capacitor 2 includes a switch 2$a$ and a capacitor 2$b$ which are connected in series. The switch 2$a$ includes two terminals and has an on (connected) state and an off (disconnected) state. One terminal is connected with the capacitor 2$b$ and the other terminal is connected with an input terminal $T_{in-}$. The switch 2$a$ becomes the on state while the pulse $\psi 2$ is inputted thereto, so one terminal $T2_{b1}$ of the capacitor 2$b$ connected therewith is electrically connected with the input terminal $T_{in-}$. On the other hand, the switch 2$a$ becomes the off state while the pulse $\psi 2$ is not inputted thereto, so the terminal $T2_{b1}$ and the input terminal $T_{in-}$ are made into an opened state. The other terminal (terminal $T2_{b2}$)

of the capacitor $2b$ is connected with a minus (−) input terminal of the operational amplifier 5.

The resistors 6, 8A, 8B, and 7 connected in series in this order are inserted between a plus (+) output terminal and a minus (−) output terminal, one terminal of a series connection thereof (that is, terminal of resistor 6) is connected with the plus (+) output terminal of the operational amplifier 5, and the other terminal of the series connection thereof (that is, terminal of resistor 7) is connected with the minus (−) output terminal of the operational amplifier 5.

With respect to the resistors 6, 7, 8A, and 8B, each of the resistors 6 and 7 has the same resistance value R1 and each of the resistors 8A and 8B has the same resistance value R2.

Relationships between the resistance values of the resistors 6 and 7 and the resistors 8A and 8B become a relationship of "R2/(R1+R2)=G/g" in a case where an amplification factor of the switched amplifier is expressed by G(=C1/C2) and an amplification factor of the operational amplifier 5 is expressed by "g".

Therefore, an output voltage Vout between the plus (+) output terminal and the minus (−) output terminal of the operational amplifier 5 is resistance-divided by the series connection of the resistors 6, 8A, 8B, and 7 to generate a voltage of "Vout×(G/g)" between a connection point P and a connection point Q. With respect to the voltage of "Vout×(G/g)", an offset voltage and a 1/f noise in the operational amplifier 5 are amplified by the amplification factor "g" of the operational amplifier 5, so the offset voltage and the 1/f noise are obtained as a substantial offset by division by the amplification factor "g" of the operational amplifier 5. The reason why the obtained offset is multiplied by the magnification factor G is as follows. A compensation voltage charged in each of capacitors $3b$ and $4b$ is redistributed based on a capacitance ratio with corresponding one of the capacitors $1b$ and $2b$. Therefore, when each voltage obtained by division is to be applied to corresponding one of the plus (+) input terminal and the minus (−) input terminal, the voltage becomes 1/G. Thus, the voltage is multiplied in advance by the magnification factor G.

The switched capacitor 3 includes a switch $3a$ and the capacitor $3b$ which are connected in series. The switch $3a$ includes one-to-two terminals (three terminals) and has a condition in which one terminal and one of two other terminals become an on (connected) state and a condition in which the one terminal and both the two other terminals become an off (disconnected) state, which are switched in response to inputted pulses ψ1 and ψ2. That is, the one terminal of the switch $3a$ is connected with one terminal $T3_{b2}$ of the capacitor $3b$, one (terminal $T3_{a1}$) of the other terminals is connected with the connection point P located between the resistor 6 and the resistor 8A, and the other (terminal $T3_{a2}$) of the other terminals is connected with the plus (+) output terminal of the operational amplifier 5. The terminal $T3_{b2}$ and the connection point P become the on state while the pulse ψ1 is inputted to the switch 3, the terminal $T3_{b2}$ and the plus (+) output terminal of the operational amplifier 5 become the on state while the pulse ψ2 is inputted thereto, and the terminal $T3_{b2}$ is made into an opened state which is not the on state with respect to both the connection point P and the plus (+) output terminal while neither the pulses ψ1 nor ψ2 are inputted thereto.

The other terminal (terminal $T3_{b1}$) of the capacitor $3b$ is connected with the plus (+) input terminal of the operational amplifier 5. When the one terminal (terminal $T3_{b2}$) and the connecting point P become the on state, a voltage value at the connection point P is charged as a plus (+) compensation voltage into the capacitor $3b$.

The switched capacitor 4 includes a switch $4a$ and the capacitor $4b$ which are connected in series. The switch $4a$ includes one-to-two terminals (three terminals) and has a condition in which one terminal and one of two other terminals become an on (connected) state and a condition in which the one terminal and both the two other terminals become an off (disconnected) state, which are switched in response to the inputted pulses ψ1 and ψ2. That is, the one terminal of the switch $4a$ is connected with one terminal $T4_{b2}$ of the capacitor $4b$, one (terminal $T4_{a1}$) of the other terminals is connected with the connection point Q located between the resistor 8B and the resistor 7, and the other (terminal $T4_{a2}$) of the other terminals is connected with the minus (−) output terminal of the operational amplifier 5. The terminal $T4_{b2}$ and the connection point Q become the on state while the pulse ψ1 is inputted to the switch 4, the terminal $T4_{b2}$ and the minus (−) output terminal of the operating amplifier 5 become the on state while the pulse ψ2 is inputted thereto, and the terminal $T4_{b2}$ is made into the opened state which is not the on state with respect to both the connection point Q and the minus (−) output terminal while neither the pulses ψ1 nor ψ2 are inputted thereto.

The other terminal (terminal $T4_{b1}$) of the capacitor $4b$ is connected with the minus (−) input terminal of the operational amplifier 5. When the one terminal (terminal $T4_{b2}$) and the connection point Q become the on state, a voltage value at the connection point Q is charged as a minus (−) compensation voltage into the capacitor $4b$.

The switch 9 includes one-to-two terminals (three terminals) and has an on state and an off state which are switched in response to the pulse ψ1 and occur between one terminal and two other terminals. The switch 9 becomes the on state while the pulse ψ2 is inputted thereto, so the terminal $T1_{b1}$ (one of the other terminals) of the capacitor $1b$ and the terminal $T2_{b1}$ (one of the other terminals) of the capacitor $2b$ are connected with a power source 12 (one terminal) to set a predetermined voltage V1. On the other hand, the switch 9 becomes the off state while the pulse ψ2 is not inputted thereto, the terminals $T1_{b1}$ and $T2_{b1}$ and the power source 12 are made into an opened state.

A switch 11 includes two terminals and is controlled so as to select one of an on state and an off state which occur between one terminal and the other terminal in response to the pulse ψ1. While the pulse ψ1 is inputted to the switch 11, the plus (+) input terminal (one terminal) of the operational amplifier 5 and the minus (−) input terminal (the other terminal) of the differential amplifier 5 become the on state. On the other hand, while the pulse ψ1 is not inputted to the switch 11, the plus (+) input terminal and the minus (−) input terminal become the off state.

The switch 10 includes two terminals as in the case of the switch 11 and is controlled so as to select one of an on state and an off state which occur between one terminal and the other terminal in response to the pulse ψ1. While the pulse ψ1 is inputted to the switch 10, the minus (−) input terminal (and the plus (+) input terminal) of the differential amplifier 5 and a power source 13 for generating the predetermined voltage V1 become the on state. On the other hand, while the pulse ψ1 is not inputted to the switch 10, the minus (−) input terminal (and the plus (+) input terminal) of the differential amplifier 5 and the power source 13 become the off state.

A switch 14 includes two terminals and is controlled so as to select one of an on state and an off state which occur between one terminal and the other terminal in response to a pulse ψ3. In order to output a result obtained by differential amplification, while the pulse ψ3 is inputted to the switch 14, the plus (+) output terminal (one terminal) of the operational amplifier 5 and an output terminal $T_{out+}$ (the other terminal) become the on state. On the other hand, while the pulse ψ3 is not inputted to the switch 14, the plus (+) output terminal (one terminal) of the operational amplifier 5 and the output terminal $T_{out+}$ become the off state.

A switch 15 includes two terminals as in the case of the switch 14 and is controlled so as to select one of an on state and an off state which occur between one terminal and the other terminal in response to the pulse ψ3. In order to output a result obtained by differential amplification, while the pulse ψ3 is inputted to the switch 15, the minus (−) output terminal (one terminal) of the operational amplifier 5 and an output terminal $T_{out−}$ (the other terminal) become the on state. On the other hand, while the pulse ψ3 is not inputted to the switch 15, the minus (−) output terminal of the operational amplifier 5 and the output terminal $T_{out−}$ become the off state.

The operational amplifier 5 amplifies a difference between voltages inputted to the plus (+) input terminal and the minus (−) input terminal by the set amplification factor "g" to generate an amplified output voltage between the plus (+) output terminal and the minus (−) output terminal.

Figure 2:
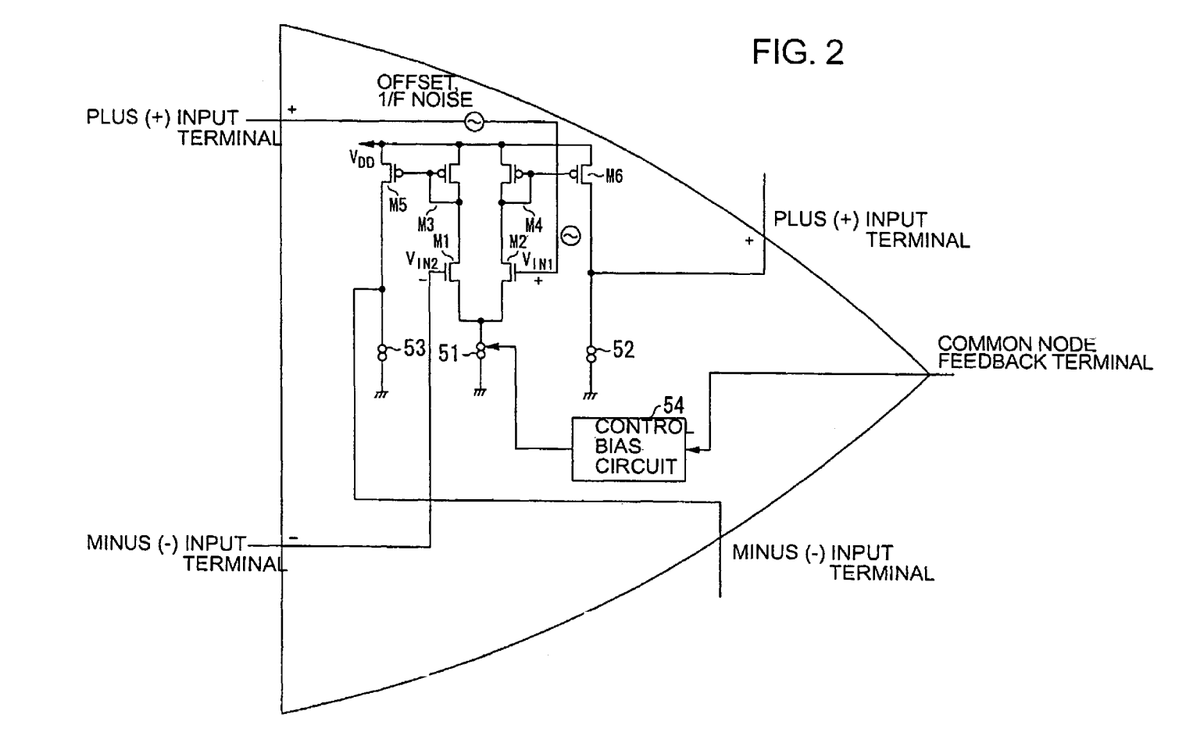
FIG. 2 is a concept diagram showing a structural example of a differential amplifier shown in FIG. 1 and a position which an offset is applied.

For example, the operational amplifier 5 has the structure shown in FIG. 2. A differential pair is composed of a MOS transistor M1 and a MOS transistor M2, and MOS transistors M3 and M4 are provided as loads of those. A constant current source 51 is provided on the source side of the MOS transistors M1 and M2. A MOS transistor M6 connected with the plus (+) input terminal and a MOS transistor M5 connected with the minus (−) output terminal are used as output transistors. Each of the MOS transistors M1 and M2 is an n-channel type and each of the MOS transistors M3, M4, M5, and M6 is a p-channel type.

Drains of the MOS transistors M5 and M6 are connected with a power source terminal and supplied with a power source voltage VDD. A source of the MOS transistor M5 is grounded through a constant current source 53. A source of the MOS transistor M6 is grounded through a constant current source 52.

A connection point S located between the resistors 8A and 8B shown in FIG. 1 is connected with a common feedback terminal of the operational amplifier 5. That is, an intermediate voltage of the output voltage Vout is fed back to the common feedback terminal.

A bias control circuit 54 controls a current value of a bias current of the constant current source 51 based on the fed back intermediate voltage.

Figure 3:
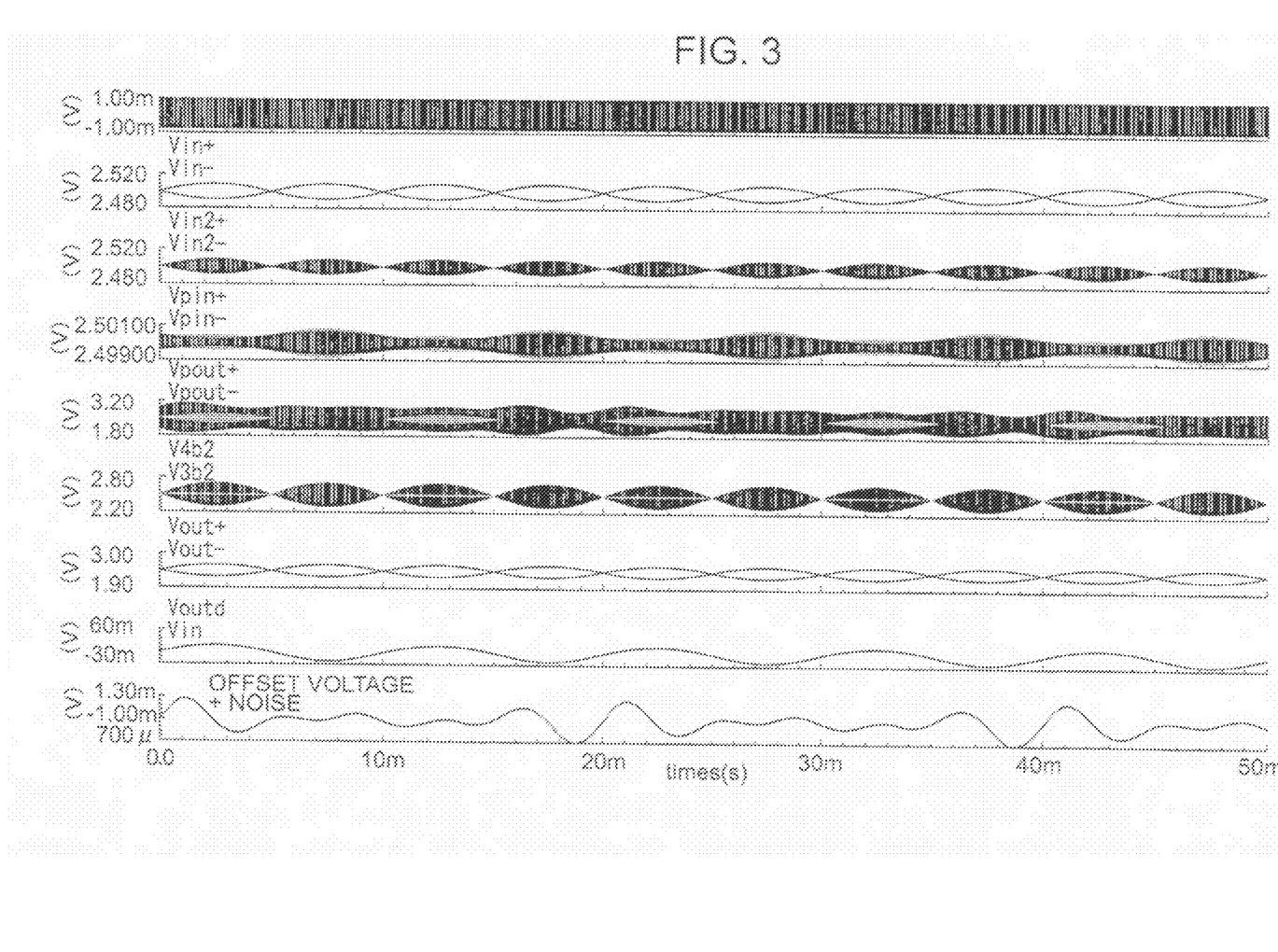
FIG. 3 is a waveform diagram showing a simulation result.
Figure 4:
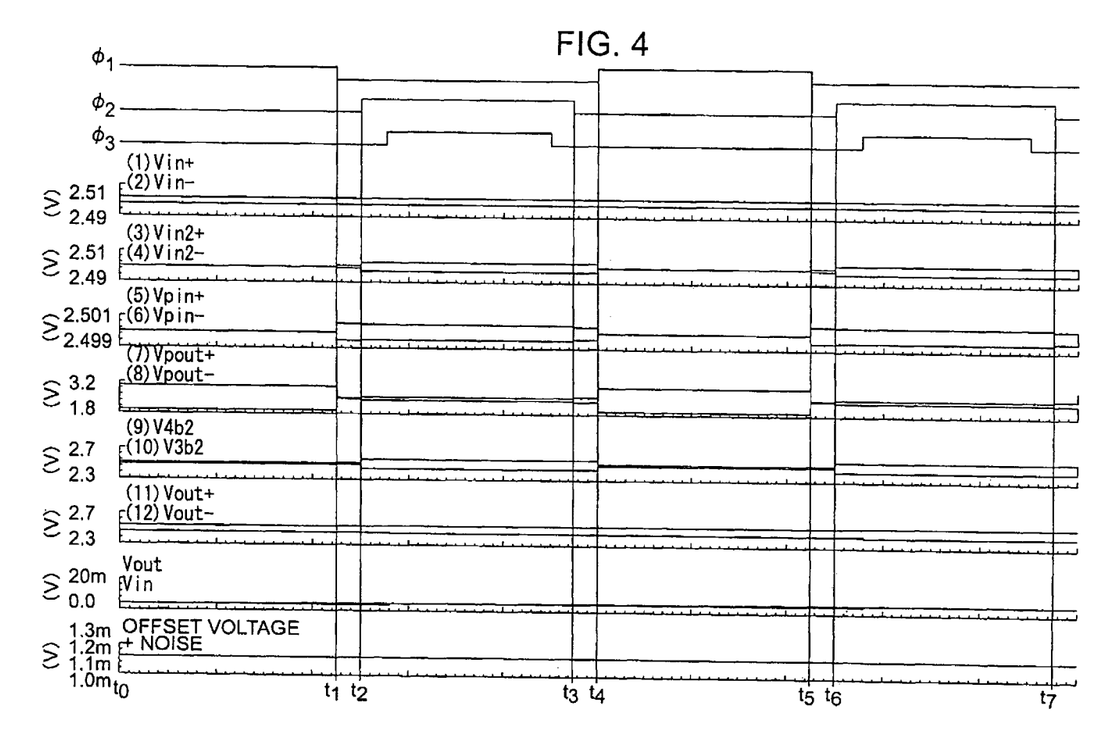
FIG. 4 is an enlarged timing chart showing a part of the simulation result shown in FIG. 3.
Figure 5:
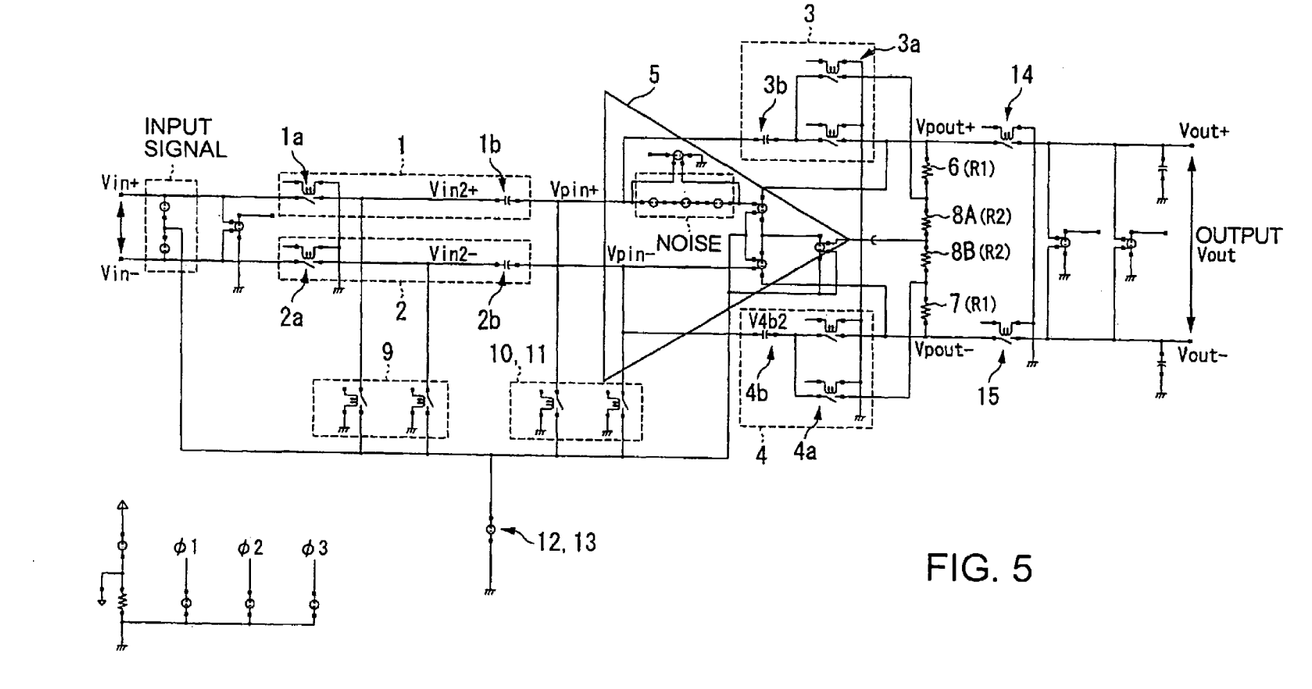
FIG. 5 an equivalent circuit of the switched capacitor which is shown in FIG. 1 and used for simulation.

Next, an operation example in this embodiment will be described with reference to FIGS. 1, 2, and 4. FIG. 3 is a waveform diagram showing a result obtained by simulation of the operation of the switched capacitor amplifier shown in FIG. 1. FIG. 4 is a diagram obtained by enlarging a part of the waveform diagram shown in FIG. 3. In each of FIGS. 3 and 4, the ordinate indicates a voltage value and the abscissa indicates a time. A simulator (SPECTRE (registered trademark) produced by Cadence Design Systems, Inc.) is used for the simulation. An equivalent circuit shown in FIG. 5 is used as the operational amplifier 5.

The following parameters provided for each element are shown as examples in the simulation. A capacitance C1 of each of the capacitances 1b and 2b is equal to 10 pF ($=10^{-11}$ F). A capacitance C2 of each of the capacitances 3b and 4b is equal to 500 fF ($=5\times10^{-13}$ F). The amplification factor G of the entire switched capacitor amplifier is equal to 20 (G=C1/C2).

The amplification factor g of the operational amplifier 5 is equal to 1000. From the above-mentioned relationship, a ratio R1:R2 between the resistance of the resistors 6 and 7 and the resistance of the resistors 8A and 8B becomes equal to 49:1, so R1 is set to 490 kΩ and R2 is set to 10 kΩ.

An offset voltage is 1 mV. A 1/f noise to be used in an offset signal of 0.6 mVp-p relative to the offset voltage of 1 mV at a frequency of 50 Hz. In this simulation, the offset signal is applied between the plus (+) input terminal and the plus (+) output terminal of the operational amplifier 5. That is, in the simulation shown in FIG. 3, a virtual offset voltage and a virtual 1/f noise are present between the plus (+) input terminal and a gate of the MOS transistor M2.

The frequency of the 1/f noise in the simulation is an example. In an actual application, the 1/f noise includes a low-frequency noise whose amplitude is large. Therefore, it is necessary to suitably adjust a timing for performing offset compensation according to a frequency of an output signal of a sensor or the like.

At a time t0, the pulse ψ1 of an "H" level is inputted and the pulses ψ2 and ψ3 are not inputted. Then, the capacitor 1b and the capacitor 2b are reset and the plus (+) compensation voltage and the minus (−) compensation voltage are charged (charges corresponding to the compensation voltages are stored) in the capacitor 3b and the capacitor 4b, respectively, in order to cancel the offset voltage and the 1/f noise.

That is, the switch 1a is in the off state because the pulse ψ2 is not inputted thereto, so the terminal $T1_{b1}$ of the capacitor 1b is electrically separated from the input terminal $T_{in+}$. The switch 2a is also in the off state, so the terminal $T2_{b1}$ of the capacitor 2b is electrically separated from the input terminal $T_{in−}$. Therefore, currents do not flow from the input terminals $T_{in+}$ and $T_{in−}$ into the capacitances 1b and 2b, with the result that charging operation based on the storage of charge is not performed.

The switch 9 is in the on state because the pulse ψ1 of the "H" level is inputted thereto, so the predetermined voltage V1 is applied to the terminal $T1_{b1}$ of the capacitor 1b and the terminal $T2_{b1}$ of the capacitor 2b to store corresponding charges.

At this time, each of the switch 10 and the switch 11 is in the on state because the pulse ψ1 is inputted thereto, the plus (+) input terminal and the minus (−) input terminal of the operational amplifier 5 are short-circuited and the predetermined voltage V1 is applied thereto. Therefore, potentials at both terminals of each of the capacitor 1b and the capacitor 2b become equal to each other (Vin2=Vin2+=Vpin−=Vpin+ =V1, V1=2.5 V in simulation) and then the capacitors are reset. Note that Vin2 denotes a voltage at the terminal $T1_{b1}$ of the capacitor 1b, Vin2 denotes a voltage at the terminal $T2_{b1}$ of the capacitor 2b, Vpin− denotes a voltage at the minus (−) input terminal of the operational amplifier 5, and Vpin+ denotes a voltage at the plus (+) input terminal thereof.

Because each of the switch 10 and the switch 11 is in the on state, the predetermined voltage V1 is applied to the terminal $T3_{b1}$ of the capacitor 3b and the terminal $T4_{b1}$ of the capacitor 4b.

At this time, the pulse ψ1 is inputted to the switch 3a and the switch 4a and the pulse ψ2 is not inputted thereto, so the terminal $T3_{b2}$ of the capacitor 3b and the terminal $T3_{a1}$ thereof become the on state and the terminal $T4_{b2}$ of the capacitor 4b and the terminal $T4_{a1}$ thereof become the on state.

Therefore, voltages produced by resistance division of the resistors 6, 8A, 8B, and 7, that is, a voltage obtained by multiplying an output voltage Vpout+ at the plus (+) input terminal of the operational amplifier 5 by G/g and a voltage obtained by multiplying an output voltage Vpout− at the minus (−) input terminal thereof by G/g are applied to the terminal T3$_{b2}$ of the capacitor 3b and the terminal T4$_{b2}$ of the capacitor 4b, respectively.

At this point, the plus (+) input terminal and the minus (−) input terminal of the operational amplifier 5 are short-circuited. Therefore, according to an imaginary short circuit characteristic, the same voltage V1(=Vpout+=Vpout−) is supposed to be outputted from the plus (+) input terminal and the minus (−) input terminal. However, the output voltage Vpout+ and the output voltage Vpout− are outputted as voltages shifted from the voltage V1 by a variation of voltage which is caused by an internal offset of the operational amplifier 5 which includes the offset voltage and the 1/f noise.

That is, in the case of this simulation, a minus (−) offset (including the offset voltage and the 1/f noise) is applied to the gate of the MOS transistor 2 of the operational amplifier 5, so the output voltage Vpout+ is shifted to the minus (−) side relative to the voltage V1 and the output voltage Vpout− is shifted to the plus (+) side relative to the voltage V1.

When the output voltage Vpout+ and the output voltage Vpout− are multiplied by G/g, voltages on which the offset voltage, the 1/f noise, and the like in the operational amplifier 5 are superimposed, which are amplified by the amplification factor G, can be obtained as the plus (+) compensation voltage and the minus (−) compensation voltage which are amplified by the amplification factor G.

Therefore, a voltage V3b2 (voltage at terminal T3$_{b2}$ of capacitor 3b) and a voltage V4b2 (terminal T4$_{b2}$ of capacitor 4b) are charged as the plus (+) compensation voltage and the minus (−) compensation voltage into the capacitor 3b and the capacitor 4b, respectively.

Next, at a time t1, the pulse ψ1 becomes a "L" level and the pulse ψ2 is not inputted, so the switches 1a, 1b, 10 and 11 are in the off state.

The switch 3a becomes an open state in which the terminal T3$_{b2}$ is not connected with any of the terminals T3$_{a1}$ and T3$_{a2}$. The switch 4a becomes an open state in which the terminal T4$_{b2}$ is not connected with any of the terminals T4$_{a1}$ and T4$_{a2}$. Each of the switches 14 and 15 continues to be in the off state because the pulse ψ3 is not inputted thereto.

The state in which the pulses ψ1 and ψ2 are not inputted is set so as to completely separate processing for resetting the capacitors 1b and 2b and charging correction voltages into the capacitors 3b and 3c while the pulse ψ1 is inputted from processing for performing differential amplification while the pulse ψ2 is inputted.

Next, at a time t2, the pulses ψ1 and ψ3 not inputted and the pulse ψ2 of the "H" level is inputted, so the switch 1a becomes the on state. Then, the input terminal T$_{in+}$ is connected with the terminal T1$_{b1}$ of the capacitor 1b, so a voltage at the terminal T1$_{b1}$ is charged (discharged) based on an input voltage Vinp. In addition, the switch 2a becomes the on state. Then, the input terminal T$_{in−}$ is connected with the terminal T2$_{b1}$ of the capacitor 2b, so a voltage at the terminal T2$_{b1}$ is charged (discharged) based on an input voltage Vin−.

When the pulse ψ2 is inputted to the switch 3a, the terminal T3$_{b2}$ of the capacitor 3b is connected with the terminal T3$_{a2}$ (plus (+) input terminal of operational amplifier 5). When the pulse ψ2 is inputted to the switch 4a, the terminal T4$_{b2}$ of the capacitor 4b is connected with the terminal T4$_{a2}$ (minus (−) input terminal of operational amplifier 5).

At this time, the voltage Vin+ at the input terminal T$_{in+}$ is applied to the terminal T1$_{b1}$ of the capacitor 1b, so the capacitor 1b is charged to a corresponding voltage. On the other hand, the plus (+) output terminal is directly connected with the terminal T3$_{b2}$ of the capacitor 3b, so the voltage Vpout+ produced without resistance division is applied thereto. Therefore, the plus (+) compensation voltage charged into the capacitor 3b relative to a voltage at the terminal T3$_{b1}$, that is, a voltage at the connection point between the capacitor 1b and the capacitor 3b is redistributed based on a capacitance ratio therebetween. Thus, the plus (+) compensation voltage is divided by the magnification factor G, with the result that the offset voltage and the 1/f noise in the operational amplifier 5, which causes the voltage at the plus (+) output terminal to be shifted from the voltage V1, are compensated.

The voltage Vin− at the input terminal T$_{in−}$ is applied to the terminal T4$_{b2}$ of the capacitor 4b, so the capacitor 2b is charged to a corresponding voltage. On the other hand, the minus (−) input terminal of the operational amplifier 5 is directly connected with the terminal T4$_{b2}$ of the capacitor 4b, so the voltage Vpout− produced without resistance division is applied thereto. Therefore, the minus (−) compensation voltage charged into the capacitor 4b relative to a voltage at the terminal T4$_{b1}$, that is, a voltage at the connection point between the capacitor 2b and the capacitor 4b is redistributed based on a capacitance ratio therebetween. Thus, the minus (−) compensation voltage is divided by the magnification factor G, with the result that the offset voltage and the 1/f noise in the operational amplifier 5, which causes the voltage at the minus (−) output terminal to be shifted from the voltage V1, are compensated.

For example, in FIG. 3, the separate plus (+) compensation voltage shifted to the minus (−) side relative to the voltage V1 is charged into the terminal T3$_{b2}$ of the capacitor 3b. Therefore, when a voltage at the plus (+) output terminal which is higher than the compensation voltage is applied, a voltage at the terminal T3$_{b1}$ of the capacitor 3b is pulled up, that is, the voltage at the terminal T3$_{b1}$ of the capacitor 3b is increased by redistributing the plus (+) compensation voltage based on the capacitance ratio between the capacitor 3b (=C2) and the capacitor 1b (C1). Thus, a plus (+) input compensation voltage is added to the voltage Vin+.

The separate minus (−) compensation voltage shifted to the plus (+) side relative to the voltage V1 is charged into the terminal T4$_{b2}$ of the capacitor 4b. Therefore, when a voltage at the minus (−) output terminal which is lower than the compensation voltage is applied, a voltage at the terminal T4$_{b1}$ of the capacitor 4b is pulled down, that is, the voltage at the terminal T4$_{b1}$ of the capacitor 4b is reduced by redistributing the minus (−) compensation voltage based on a capacitance ratio between the capacitor 4b (=C2) and the capacitor 2b (C1). Thus, a minus (−) input compensation voltage is added to the voltage Vin−.

As described above, at the time of measurement, the plus (+) input compensation voltage and the minus (−) input compensation voltage which are used to cancel the offset voltage and the 1/f noise in the operational amplifier 5 are applied to the plus (+) input terminal and the minus (−) input terminal of the operational amplifier 5 based on the plus (+) compensation voltage and the minus (−) compensation voltage which are charged into the capacitor 3b and the capacitor 4b. Therefore, the voltage Vpout+ outputted from the plus (+) output terminal of the operational amplifier 5 and the voltage Vpout− outputted from the minus (−) output terminal thereof are substantially compensated.

Thus, according to the switched capacitor amplifier (differential amplifier) of the present invention, the influence of the offset voltage and 1/f noise in the used operational amplifier 5 can be removed to perform differential amplification between the input voltages Vin+ and Vin− at high precision.

Next, at a time t3, any of the pulses ψ1, ψ2, and ψ3 not inputted. Then, the switch 1a becomes the off state, so the terminal T1$_{b1}$ of the capacitor 1b and the input terminal T$_{in+}$ are made into the opened state. In addition, the switch 2a becomes the off state, so the terminal T2$_{b1}$ of the capacitor 2b and the input terminal T$_{in−}$ are made into the opened state.

Next, at a time t4, the same operation as that at the time t0 is performed. At a time t5, the same operation as that at the time t1 is performed. At a time t6, the same operation as that at the time t2 is performed. At a time t7, the same operation as that at the time t3 is performed. After that, those operations are performed continuously and repeatedly.

As is apparent from FIG. 4, an input voltage Vin(potential difference between Vin+ and Vin−) is substantially equal to an output voltage Voutd (Vout/G) and thus the influence of the offset voltage and the 1/f noise which are provided for the operational amplifier 5 is removed.

The pulse ψ3 for putting the output voltage Vout to the outside are inputted during a period between the time t2 and the time t3 and a period between the time t6 and the time t7, that is, during a period for which the pulse ψ2 is being inputted. After the lapse of a period T for which the pulse ψ2 is inputted to remove the influence of the offset voltage and the 1/f noise and the output voltage Vout is stabilized, the pulse ψ3 is inputted to output the output voltage Vout (plus (+) output Vout+ and minus (−) output Vout−) to the outside.

The pulses ψ1, ψ2, and ψ3 are outputted from a control circuit (not shown) as shown in the timing chart of FIG. 4. That is, the following operation is periodically performed. The control circuit outputs the pulse ψ1 to the capacitors 3b and 4b for a period for charging the plus (+) compensation voltage and the minus (−) compensation voltage. After the lapse of a period for which no pulse is generated, the pulse ψ2 is generated for a period for which differential amplification on an inputted voltage is performed. After the lapse of a period for which no pulse is generated, the pulse ψ1 is generated.

The invention claimed is:

1. A switched capacitor amplifier having an operational amplifier and switched capacitors, for amplifying a differential voltage between voltages inputted to a plus (+) input terminal and a minus (−) input terminal of the operational amplifier while an offset including a noise of the operational amplifier is compensated, and outputting an amplified voltage between a plus (+) output terminal and a minus (−) output terminal, the switched capacitor amplifier comprising:
   a first switched capacitor one terminal of which is connected with the plus (+) input terminal and an other terminal of which is applied with an input voltage;
   a second switched capacitor one terminal of which is connected with the minus (−) input terminal and an other terminal of which is applied with an input voltage;
   a third switched capacitor which is inserted between the plus (+) input terminal and the plus (+) output terminal and provided to set an amplification factor in cooperation with the first switched capacitor and store a plus (+) compensation voltage for compensating for an offset, which is applied to the plus (+) input terminal; and
   a fourth switched capacitor which is inserted between the minus (−) input terminal and the minus (−) output terminal and provided to set an amplification factor in cooperation with the second switched capacitor and store a minus (−) compensation voltage for compensating for an offset, which is applied to the minus (−) input terminal.

2. A switched capacitor amplifier according to claim 1, comprising a short-circuit switch connected between the plus (+) input terminal and the minus (−) input terminal.
   wherein the plus (+) compensation voltage and the minus (−) compensation voltage are stored based on voltages outputted from the plus (+) output terminal and the minus (−) output terminal, when a compensation voltage at the plus (+) input terminal and a compensation voltage at the minus (−) input terminal are to be stored in the third switched capacitor and the fourth switched capacitor, while the short-circuit switch is turned on to short-circuit between the plus (+) input terminal and the minus (−) input terminal.

3. A switched capacitor amplifier according to claim 1, comprising a first resistor, a second resistor, and a third resistor connected in series between the plus (+) output terminal and the minus (−) output terminal,
   wherein one terminal of the second resistor is connected with the third switched capacitor and an other terminal of the second resistor is connected with the fourth switched capacitor when the plus (+) compensation voltage and the minus (−) compensation voltage are to be stored in the third switched capacitor and the fourth switched capacitor, respectively.

4. A switched capacitor amplifier according to claim 3, wherein when an amplification factor of the switched capacitor amplifier is expressed by G, an amplification factor of the operational amplifier is expressed by g, a resistance value of each of the first and third resistors is expressed by R1, and a resistance value of the second resistor is expressed by R2, a relationship among the resistance values of the first resistor, the second resistor, and third resistor is expressed by a formula: $R2/(2R1+R2)=G/g$.

5. A switched capacitor amplifier according to claim 1, wherein processing for storing the plus (+) compensation voltage and the minus (−) compensation voltage is performed at a cycle shorter than a cycle of a 1/f noise during a period for which differential amplification processing is not performed.

6. A method of operating a switched capacitor amplifier, the switched capacitor amplifier including:
   an operational amplifier;
   a first switched capacitor one terminal of which is connected with a plus (+) input terminal of the operational amplifier and an other terminal of which is applied with an input voltage,
   a second switched capacitor one terminal of which is connected with a minus (−) input terminal of the operational amplifier and an other terminal of which is applied with an input voltage;
   a third switched capacitor which is inserted between the plus (+) input terminal and the plus (+) output terminal and provided to set an amplification factor in cooperation with the first switched capacitor and store a plus (+) compensation voltage to be applied to the plus (+) input terminal;
   a fourth switched capacitor which is inserted between the minus (−) input terminal and the minus (−) output terminal and provided to set an amplification factor in cooperation with the second switched capacitor and store a minus (−) compensation voltage to be applied to the minus (−) input terminal; and
   a short-circuit switch connected between the plus (+) input terminal and the minus (−) input terminal,
   for amplifying a differential voltage between voltages inputted to the plus (+) input terminal and the minus (−) input terminal of the operational amplifier, and outputting an amplified voltage between a plus (+) output terminal and a minus (−) output terminal,
   the method comprising the steps of: turning on the short-circuit switch when the plus (+) compensation voltage and the minus (−) compensation voltage are to be stored in the third switched capacitor and the fourth switched capacitor, respectively, to store the plus (+) compensation voltage and the minus (−) compensation voltage based on voltages outputted from the plus (+) output terminal and the minus (−) output terminal.

* * * * *

UNITED STATES PATENT AND TRADEMARK OFFICE
CERTIFICATE OF CORRECTION

PATENT NO. : 7,446,602 B2  Page 1 of 1
APPLICATION NO. : 11/703069
DATED : November 4, 2008
INVENTOR(S) : Kiyoshi Yoshikawa It is certified that error appears in the above-identified patent and that said Letters Patent is hereby corrected as shown below:

On the Title Page

In column 1, before item (56), insert a new item as follows:

--Foreign Application Priority Data

February 6, 2006   Japan   2006-028760--.

Signed and Sealed this

Seventeenth Day of March, 2009

JOHN DOLL
*Acting Director of the United States Patent and Trademark Office*